(12) United States Patent
Kim

(10) Patent No.: US 8,975,945 B2
(45) Date of Patent: Mar. 10, 2015

(54) INPUT AND OUTPUT DEVICE AND SYSTEM INCLUDING THE SAME

(71) Applicant: SK Hynix Inc., Icheon-si Gyeonggi-do (KR)

(72) Inventor: Dong Kyun Kim, Cheongju-si Chungcheongbuk-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/154,391

(22) Filed: Jan. 14, 2014

(65) Prior Publication Data

US 2014/0368252 A1 Dec. 18, 2014

(30) Foreign Application Priority Data

Jun. 17, 2013 (KR) .................. 10-2013-0068923

(51) Int. Cl.
*H03L 5/00* (2006.01)
*H03K 19/0185* (2006.01)

(52) U.S. Cl.
CPC .......................... *H03K 19/018521* (2013.01)
USPC ................. 327/333; 326/62; 326/81

(58) Field of Classification Search
USPC ............ 327/108–109, 306, 333; 326/62–63, 326/80–81
See application file for complete search history.

(56) References Cited

U.S. PATENT DOCUMENTS

| | | | |
|---|---|---|---|
| 5,023,472 A | 6/1991 | Hashimoto et al. | |
| 5,786,720 A | 7/1998 | Nguyen et al. | |
| 6,972,596 B1* | 12/2005 | Proebsting et al. | ............. 326/83 |
| 2001/0011017 A1 | 8/2001 | Biedermann et al. | |
| 2006/0221717 A1 | 10/2006 | Lee | |
| 2007/0035180 A1 | 2/2007 | Jang | |
| 2011/0157129 A1 | 6/2011 | Song et al. | |
| 2013/0082743 A1* | 4/2013 | Sato et al. | ..................... 327/107 |

FOREIGN PATENT DOCUMENTS

| | | |
|---|---|---|
| KR | 1019990063790 A | 7/1999 |
| KR | 1020040078256 A | 9/2004 |
| KR | 100631174 B1 | 9/2006 |
| KR | 1020070006547 A | 1/2007 |
| KR | 1020110074118 A | 6/2011 |

* cited by examiner

*Primary Examiner* — Dinh Le
(74) *Attorney, Agent, or Firm* — William Park & Associates Patent Ltd.

(57) ABSTRACT

An I/O device comprises a driving unit coupled between a first voltage and a second voltage, and configured to receive a first signal so as to drive a second signal for swing with a second swing range narrower than a first swing range between the first voltage and the second voltage and supply the second signal to a transmission line. The driving unit includes a first stabilizer coupled between the first voltage and the transmission line and a second stabilizer coupled between the second voltage and the transmission line.

12 Claims, 6 Drawing Sheets

INPUT AND OUTPUT DEVICE AND SYSTEM INCLUDING THE SAME

CROSS-REFERENCE TO RELATED APPLICATION

The present application claims priority under 35 U.S.C 119(a) to Korean patent application No. 10-2013-0068923, filed on Jun. 17, 2013, in the Korean Intellectual Property Office, which is incorporated herein by reference in its entirety as set forth in full.

BACKGROUND OF THE INVENTION

1) Field of the Invention

The present invention relates generally to an input and output (I/O) device and an I/O system, and more particularly to an I/O device and an I/O system that adjusts a voltage swing range.

2) Description of the Related Art

I/O devices have been widely used in electronic equipment. In order to distinguish whether a bit has one of two values in electronic circuits, a voltage or current is typically set to have a smaller or larger value compared with a reference value. As a result, two phases are distinguished and driven to perform an I/O operation.

If a voltage or current is greatly differentiated from the reference value, a read/write margin is increased so that data that have two values may be easily distinguishable. However, increasing the read/write margin leads to an increase in driving power consumption. Further, it is difficult to secure the driving speed when the read/write margin is increased.

BRIEF SUMMARY OF THE INVENTION

Embodiments of the present invention are directed to reducing a swing range of voltage or current in an input/output device to improve the operating speed of the input/output device.

Embodiments of the present invention are also directed to reducing the swing range of voltage or current in the input/output device to minimize the power consumption even if an I/O operation is repeatedly performed.

Embodiments of the present invention are also directed to improving the operating speed and reducing the power consumption of the input/output device so that the input/output device may be more suitable to be used in or as portable electronic equipment.

According to an embodiment of the present invention, an input/output device comprises: a driving unit coupled between a first voltage and a second voltage, and configured to receive a first signal so as to drive a second signal to swing with a second swing range narrower than a first swing range, where the first swing range is between the first voltage and the second voltage, and the driving unit is configured to supply the second signal to a transmission line. The driving unit includes a first stabilizer coupled between the first voltage and the transmission line and a second stabilizer coupled between the second voltage and the transmission line.

The I/O device further comprises a receiver configured to receive the second signal through the transmission line so as to output a third signal.

The driving unit comprises: a pull-up unit including the first stabilizer and configured to drive the first signal to a high level; and a pull-down unit including the second stabilizer and configured to drive the first signal to a low level.

The pull-up unit comprises a pull-up transistor coupled between the first stabilizer and the transmission line, and the pull-down unit comprises a pull-down transistor coupled between the second stabilizer and the transmission line.

The first stabilizer is a first diode-connected transistor coupled serially between the first voltage and the pull-up transistor, and the second stabilizer is a second diode-connected transistor coupled serially between the second voltage and the pull-down transistor.

A maximum point of the second swing range is less than the first voltage by a threshold voltage of the first diode-connected transistor, and a minimum point of the second swing range is greater than the second voltage by a threshold voltage of the second diode-connected transistor.

The I/O device further comprises a pre-driver unit configured to supply a pull-up driving signal to the pull-up transistor in response to the first signal, based on a third voltage lower than the second voltage, or to supply a pull-down driving signal to the pull-down transistor in response to the first signal, based on a fourth voltage higher than the first voltage.

The receiver comprises a third stabilizer coupled between the first voltage and the transmission line and a fourth stabilizer coupled between the second voltage and the transmission line, wherein the receiver supplies a third signal that swings within the second swing range.

The first stabilizer and the third stabilizer are voltage lowering elements with the same structure, and the second stabilizer and the fourth stabilizer are voltage lowering elements with the same structure.

The I/O device further comprises a level shifter configured to receive the second signal from the receiver so as to move a voltage to fall within the first swing range.

The transmission line includes at least one selected from a resistance component and a capacitance component.

The transmission line includes a global I/O line.

According to still another embodiment of the present invention, a I/O system comprises: a driving unit configured to narrow a first swing range between a first voltage and a second voltage so as to supply a transmission data signal that falls within a second swing range; a transmission line configured to transmit the transmission data signal by a reception data signal; a receiver configured to adjust a swing range so that the reception data signal has the same second swing range as that of the transmission data signal; and a level shifter configured to adjust a voltage level so that the second swing range has the first swing range so as to supply a data output signal.

Thus, the I/O device and the I/O system according to an embodiment of the present invention provide advantages by making it possible to reduce a voltage width which swings depending on a data value, thereby minimizing the power consumption.

Also, the I/O device and the I/O system according to an embodiment of the present invention provide advantages by making it possible to minimize a change width of voltage used in the I/O operation, thereby improving the I/O operating speed.

Moreover, the I/O device and the I/O system according to an embodiment of the present invention comprises components to prevent degradation of driving capacity when the change width of voltage becomes smaller, thereby minimizing the degradation of the driving capacity resulting from swing range decrease of voltage.

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DESCRIPTION OF EMBODIMENTS

Example embodiments of the present invention will be described in detail with reference to the attached drawings. Wherever possible, the same reference numbers will be used throughout the drawings to refer to the same or like parts, and a repeated description of the same or like parts will not be given.

Embodiments described herein with reference to the drawings that are schematic or functional illustrations of example embodiments are for illustrative purposes only. As such, variations from the shapes of the illustrations as a result of, for example, manufacturing techniques and/or tolerances, are to be expected. Thus, example embodiments of the present invention should not be construed as being limited to the particular shapes of regions illustrated herein, but may include deviations in shapes that result, for example, from manufacturing.

Figure 1:
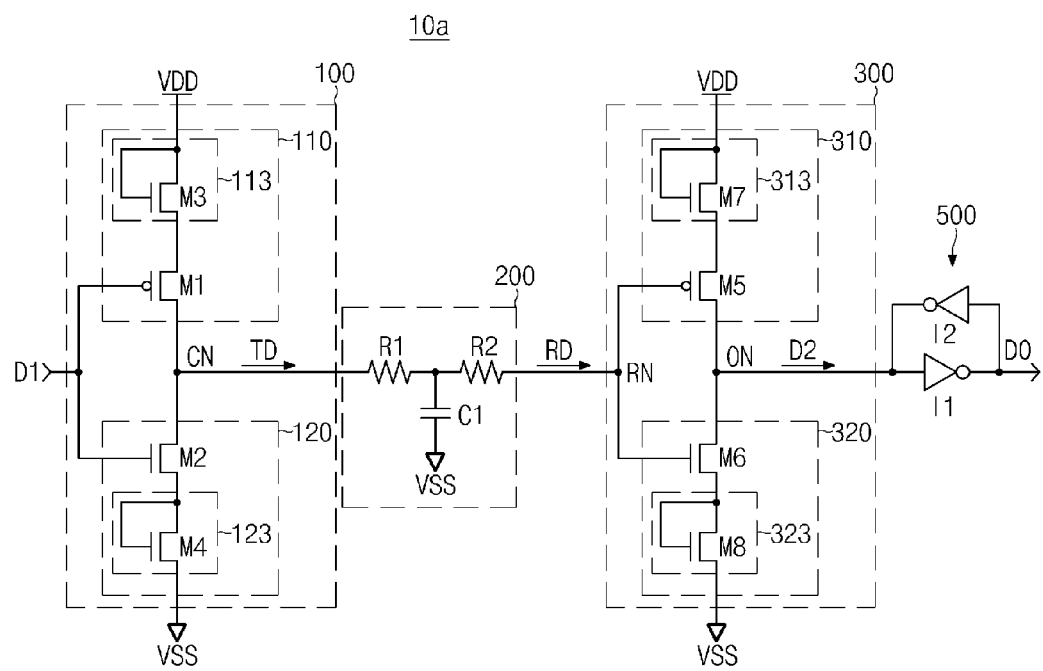
FIG. 1 illustrates a circuit diagram of an I/O device according to an embodiment of the present invention.

FIG. 1 illustrates a circuit diagram of an input/output (I/O) device according to an embodiment of the present invention.

Referring to FIG. 1, an I/O device 10a includes a driving unit 100, a transmission line 200, and a receiver 300.

The driving unit 100 is coupled between a first voltage VDD and a second voltage VSS. According to an embodiment of the present invention, the first voltage VDD may correspond to a source voltage, and the second voltage VSS may correspond to a ground voltage. The driving unit 100 receives a first data signal D1 to supply a transmission data signal TD to the transmission line 200. The transmission line 200 may be coupled with a common node CN. The transmission data signal TD may have a second swing range narrower than a first swing range, where the first swing ranges between the first voltage VDD and the second voltage VSS. According to an embodiment of the present invention, the second swing range may vary.

The driving unit 100 includes a pull-up unit 110 and a pull-down unit 120. The pull-up unit 110 includes a first stabilizer 113 that drives the first data signal D1 to a logic 'high'. The pull-up unit 110 may be coupled between the first voltage VDD and the common node CN. The pull-up unit 110 may pull up the first data signal D1 towards the first voltage VDD, that is, to the logic 'high', in response to the first data signal D1.

The pull-up unit 110 includes the first stabilizer 113 and a pull-up transistor M1 which are serially coupled between the first voltage VDD and the common node CN. In other words, the first stabilizer 113 may be coupled between the first voltage VDD and the transmission line 200. According to an embodiment of the present invention, first stabilizer 113 may comprise a diode-connected transistor M3 including a gate terminal coupled with the first voltage VDD. The diode-connected transistor M3 includes a first terminal, coupled with the first voltage VDD and a second terminal coupled with the pull-up transistor M1.

The first stabilizer 113 supplies a third voltage, reduced by a predetermined voltage from the first voltage VDD, to a second terminal of the pull-up transistor M1. According to an embodiment of the present invention, if the first stabilizer 113 is a diode-connected transistor, the third voltage may correspond to a difference between the first voltage VDD and a threshold voltage Vt of the diode-connected transistor M3. The third voltage becomes a maximum point of the second swing range.

The pull-up transistor M1 includes the second terminal coupled with the second terminal of the diode-connected transistor M3, a first terminal coupled with the common node CN (in other words, the first terminal may be coupled with the transmission line 200), and a gate terminal to receive the first data signal D1. In other words, the pull-up transistor M1 may be coupled between the first stabilizer 113 and the transmission line 200.

In response to the first data signal D1, the pull-up transistor M1 supplies the third voltage to the common node CN. For example, when the first data signal D1 has a lower value than a threshold voltage of the pull-up transistor M1, the pull-up transistor M1 turns on. As a result, the third voltage is provided to the common node CN. In some embodiment, the third voltage does not equal to the first voltage VDD. For example, the third voltage may have a value decreased by the threshold voltage Vt of the diode-connected transistor M3. The third voltage becomes a maximum point of the second swing range.

The pull-down unit 120 included in the driving unit 100 includes a second stabilizer 123 for driving the first data signal D1 to a logic 'low'. The pull-down unit 120 may be coupled between the common node CN and the second voltage VSS. The pull-down unit 120 may pull down the first data signal D1 towards the second voltage VSS, that is, to the logic 'low', in response to the first data signal D1.

The pull-down unit 120 includes the second stabilizer 123 and a pull-down transistor M2 which are serially coupled between the second voltage VSS and the common node CN. In other words, the second stabilizer 123 may be coupled between the second voltage VSS and the transmission line 200. In one embodiment, the second stabilizer 123 comprises a diode-connected transistor M4. According to an embodiment of the present invention, the diode-connected transistor M4 may include a second terminal coupled with the second voltage VSS, a first terminal coupled with a second terminal of the pull-down transistor M2, and a gate terminal that is also coupled with the second terminal of the pull-down transistor M2. That is, the first terminal and the gate terminal of the diode-connected transistor M4 are coupled in common with the second terminal of the pull-down transistor M2.

The pull-down transistor M2 includes the second terminal coupled with a first terminal of the diode-connected transistor M4, a first terminal coupled with the common node CN, and a gate terminal to receive the first data signal D1. In other words, the pull-down transistor M2 may be coupled between the second stabilizer 123 and the transmission line 200.

The pull-down transistor M2 receives a fourth voltage from the second stabilizer 123, and supplies the fourth voltage to the common node CN in response to the first data signal D1. For example, if the first data signal D1 has a value greater than a threshold voltage of the pull-down transistor M2, the pull-down transistor M2 is turned on, and thus the fourth voltage is provided to the common node CN.

The fourth voltage may have a voltage value increased by a predetermined voltage, and thus, in some embodiment the fourth voltage does not equal the second voltage VSS. According to an embodiment of the present invention, if the second stabilizer 123 is a diode-connected transistor M4, the fourth voltage may have a value increased by a threshold voltage Vt of the diode-connected transistor M4 from the second voltage VSS. That is, the fourth voltage may be the second voltage VSS increased by the threshold voltage Vt of the diode-connected transistor M4. The fourth voltage becomes a minimum point of the second swing range.

In other words, the operation of the driving unit 100 is performed as follows. The pull-up transistor M1 and the pull-down transistor M2 are complementarily operated to drive the first data signal D1 to have the second swing range between the third voltage and the fourth voltage, thereby providing the transmission signal TD to the common node CN.

For example, the driving unit 100 drives the first data signal D1 to a third voltage level if the first data signal D1 is smaller than the threshold voltage of the pull-up transistor M1. The driving unit 100 may drive the first data signal D1 to a fourth voltage level if the first data signal D1 is larger than the threshold voltage of the pull-down transistor M2. The driving unit 100 may supply the driven signal to the common node CN. As a result, the first data signal D1 is changed to have the second swing range between the third voltage and the fourth voltage.

If the driving unit 100 does not include the first stabilizer 113 and the second stabilizer 123, the first data signal D1 swings between the first swing range. As a result, the driving unit 100 according to the present invention can reduce the swing range of a data signal by a predetermined voltage value. According to an embodiment of the present invention, a difference between the first swing range and the second swing range may correspond to a sum of the threshold voltage of the diode-connected transistor M3 (which is an example of the first stabilizer 113) and the threshold voltage of the diode-connected transistor M4 (which is an example of the second stabilizer 123).

In this way, when the swing range of the first data signal D1 is reduced, the time that it takes for the first data signal D1 to reach the logic 'high' level and the logic 'low' level decreases. Also, since each voltage of the logic 'high' level and the logic 'low' level is lowered, the power consumption required to drive the voltages may be reduced. Furthermore, as described below, the effect of parasitic elements may be reduced when data are transmitted.

Although, in FIG. 1, the pull-up transistor M1 is shown to be a PMOS transistor and the pull-down transistor M2 is shown to be a NMOS, the pull-up transistor M1 and the pull-down transistor M2 may be implemented using other types of transistors.

The transmission data signal TD provided to the common node CN is applied to the transmission line 200. The transmission line 200 includes resistance components R1, R2 and a capacitance component C1. The resistance components R1, R2 and the capacitance component C1 may be included in any elements for transmitting data.

In one embodiment, the transmission line 200 may comprise a global I/O line. Since a global I/O line included in a memory device may be coupled with a plurality of local I/O lines, the resistance components and the capacitance component included in the global I/O line may become large and thus the global I/O line cannot be disregarded. If the resistance components and the capacitance component are large, reducing the swing range of voltage level of the transmission data signal TD may make a big a difference.

If a voltage value supplied along the transmission line 200 is large, influences from the resistance components R1, R2 and the capacitance component C1 of the transmission line 200 will be large. For example, a voltage difference between the common node CN and a receiving node RN may correspond to a value obtained by multiplying a sum of the resistance components R1, R2 and the capacitance component C1 by a value corresponding to a voltage level of the transmission data signal TD.

Therefore, when the transmission data signal TD is transmitted through the transmission line 200, it is preferable that the swing range of the transmission data signal TD is small in order to minimize signal variation of the signal reaching the receiving node RN.

In an embodiment of the present invention, the driving unit 100 may reduce the swing range of the transmission data signal TD so that a reception data signal RD that reaches the receiving node RN may have a small difference from the transmission data signal TD. Moreover, since the charge amount that may be stored in the capacitance component C1 within the transmission line 200 is reduced, the transmission speed can be improved.

The receiver 300 may include elements similar to those of the driving unit 100. The receiver 300 receives the reception data signal RD through the receiving node RN. The receiver 300 may be coupled between the first voltage VDD and the second voltage VSS. The receiving node RN may be coupled with the transmission line 200. In an ideal case, the reception data signal RD received through the receiving node RN has the same value as that of the transmission data signal TD. However, as described above, the value applied through the receiving node RN resulting from the resistance components R1, R2 and the capacitance component C1 included in the transmission line 200 corresponds to that of the transmission data signal TD but, in some instances, is not identical with that of the transmission data signal TD. Thus, in the specification of the present invention, the signal applied through the receiving node RN is called the reception data signal RD distinguishable from the transmission data signal TD.

The receiver 300 performs a pull-up or pull-down operation in response to the reception data signal RD. Similar to the driving unit 100, the receiver 300 may include a pull-up unit 310 and a pull-down unit 320. The pull-up unit 310 includes a third stabilizer 313, and the pull-down unit 320 includes a fourth stabilizer 323.

The receiver 300, similar to the driving unit 100, may be coupled between the first voltage VDD and the second voltage VSS. Operating features of the third stabilizer 313 are substantially similar to operating features of the first stabilizer 113. Thus the third stabilizer may decrease a voltage such that the voltage falls between a third voltage and the first voltage VDD. In a similar way, operating features of the fourth stabilizer 323 may be substantially similar to operating features of the second stabilizer 123. Thus, the fourth stabilizer 323 may increase a voltage such that the voltage falls between a fourth voltage and the second voltage VSS.

That is, the receiver 300 adjusts a swing range of a second data signal D2 supplied through the receiving node RN to an output node ON to have the second swing range which may be a swing range determined by the driving unit 100. As a result, a reference to a data signal for determining a first state or a second state is adjusted to secure a voltage margin. For example, since the first data signal D1 swings within the first swing range, the reference point for determining a data value can be established based on a center point of the first swing range. Since the first data signal D1 is transmitted as the transmission data signal TD or the reception data signal RD, and the transmission data signal TD and the reception data signal RD swing within the second swing range, it is necessary to adjust the reference for the swing range. Thus, the receiver 300 has a substantially similar configuration so as to reduce the swing range of a data signal in a substantially similar manner as the driving unit 100.

The third stabilizer 313 may comprise a diode-connected transistor M7 including a gate terminal and a first terminal each coupled with the first voltage VDD. The third stabilizer 312 may be coupled between the first voltage VDD and the transmission line 200.

The pull-up unit 310 may include a pull-up transistor M5 coupled between the third stabilizer 313 and the output node ON. The pull-up transistor M5 may include a second terminal coupled with a second terminal of the diode-connected transistor M7, a first terminal coupled with the output node ON, and a gate terminal coupled with the receiving node RN.

The pull-down unit 320 may include a pull-down transistor M6 coupled between the fourth stabilizer 323 and the output node ON. The pull-down transistor M6 may include a first terminal coupled with the output node ON, a second terminal coupled with a first terminal of the diode-connected transistor M8, and a gate terminal coupled with the receiving node RN.

The fourth stabilizer 323 may include the diode-connected transistor M8 including a second terminal coupled with the second voltage VSS, and a first terminal and a gate terminal each coupled with the second terminal of the pull-down transistor M6. The fourth stabilizer 323 may be coupled between the second voltage VSS and the transmission line 200.

The pull-up transistor M5 and the pull-down transistor M6 are configured to supply the second data signal D2 to the output node ON in response to the reception data signal RD.

Since the second data signal D2 swings between the third voltage and the fourth voltage, it is necessary to adjust a level of the second data signal D2 in order to set an operating voltage of peripheral circuits. For example, assuming that peripheral circuits such as the I/O device 10a operate between the first voltage VDD and the second voltage VSS, if the second data signal D2 is provided, unadjusted, with the second swing range, a signal may not be recognized as a valid value.

As a result, the I/O device 10a according to an embodiment of the present invention may further include a latch 500 configured to serve as a level shifter. The latch 500 may include a first inverter I1 and a second inverter I2. I/O terminals of each inverter I1 and I2 are cross-coupled with each other. Specifically, an input terminal of the first inverter I1 is coupled with the output node ON, and an output terminal of the second inverter I2 is coupled with the output node ON. An output terminal of the first inverter I1 is coupled in common with an input terminal of the second inverter I2.

The first inverter I1 and the second inverter I2 of the latch 500 are configured to compensate the narrowed swing voltage of the second data signal D2 so as to enlarge the swing range of the second data signal D2 closer to the first swing range.

Specifically, although it is not shown in FIG. 1, a final driving circuit for receiving a data output signal DO from the latch 500 may be connected with the I/O device. The final driving circuit may include a PMOS transistor and a NMOS transistor complementarily coupled between the first voltage VDD and the second voltage VSS.

For example, when the high point of the 'high' level swing of the second data signal D2 is a third voltage, the 'low' level swing of the data output signal DO (which is a signal obtained by inverting the second data signal D2 by the first inverter I1) may have an absolute value corresponding to the third voltage. In this case, the PMOS transistor of the final driving circuit may be fully turned on but the NMOS transistor may be only slightly turned on. As a result, a turn-on element through the NMOS transistor feeds back through the second inverter I2 so as to complement the level of the second data signal D2. In a similar way, the 'low' level of the second data signal D2 is complemented so that the data output signal DO swings fully between the first voltage VDD and the second voltage VSS to have the first swing range.

Figure 2:
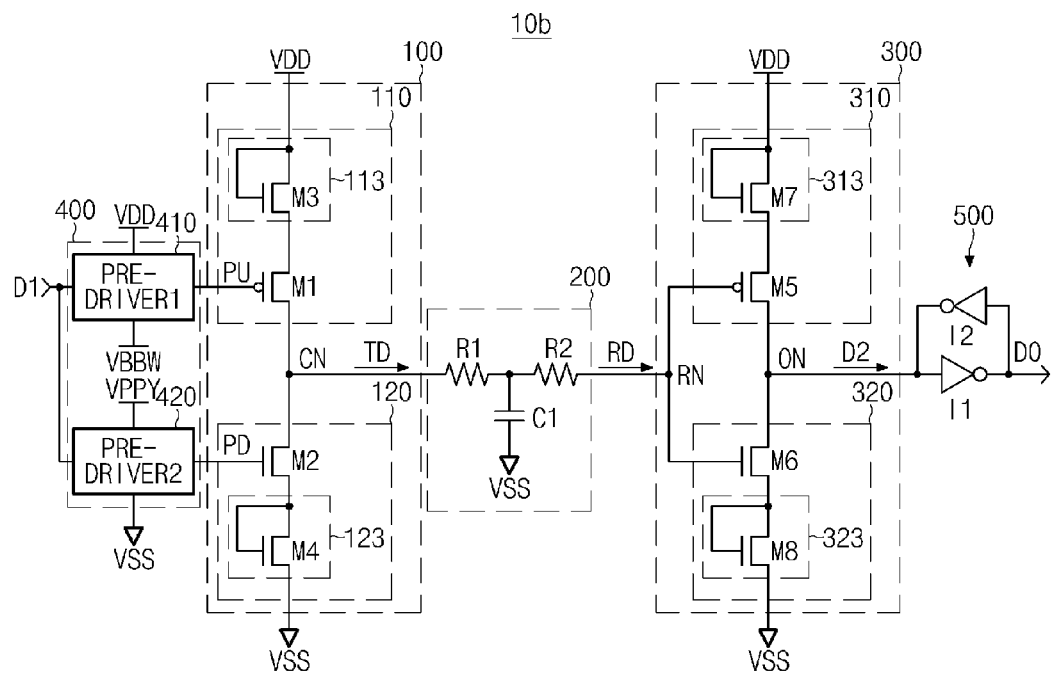
FIG. 2 illustrates a circuit diagram of an I/O device according to an embodiment of the present invention.

FIG. 2 illustrates a circuit diagram of an I/O device according to an embodiment of the present invention.

Referring to FIG. 2, an I/O device 10b includes a driving unit 100, a transmission line 200, a receiver 300, and a pre-driver unit 400.

In comparison with the I/O device 10a of FIG. 1, the I/O device 10b of FIG. 2 further includes the pre-driver unit 400. According to an embodiment of the present invention, the I/O device 10b may further include a latch 500. Reference numbers of FIG. 2 may refer to identical or similar elements illustrated in FIG. 1, a repeated explanation of the identical or similar elements will not be given because the functions and/or features of the identical or similar elements are substantially the same.

The I/O device 10b responds to the first data signal D1 to be driven to a fifth voltage VPPY, higher than the first voltage VDD, or a sixth voltage VBBW, lower than the second voltage VSS. Accordingly, the fifth voltage VPPY and/or the sixth voltage VBBW may be supplied to the pull-up unit 110 or the pull-down unit 120 of the driving unit 100.

Figure 3A:
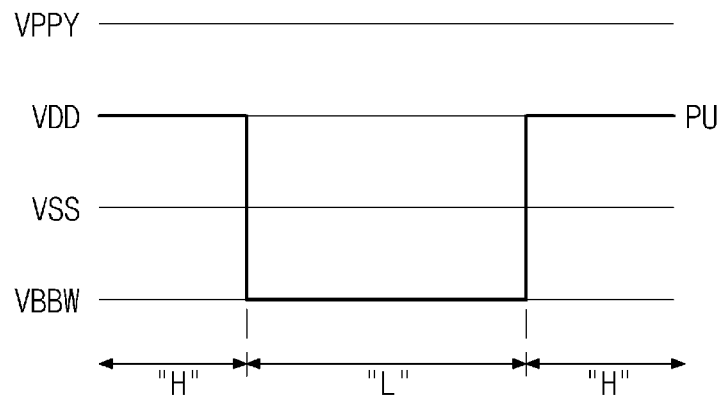
FIGS. 3a and 3b illustrate a driving data signal supplied from a pre-driver unit according to an embodiment of the present invention.
Figure 3B:
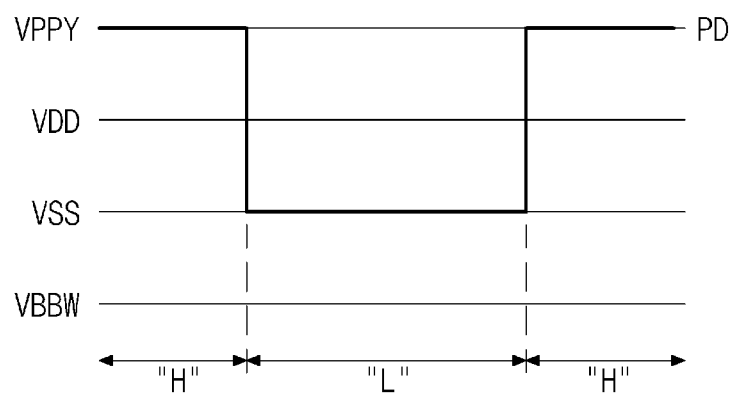

FIGS. 3a and 3b illustrate a driving data signal supplied from the pre-driver unit 400 according to an embodiment of the present invention.

FIGS. 3a and 3b show that "H" represents when the first data signal D1 corresponds to the logic 'high', and that "L" represents when the first data signal D1 corresponds to the logic 'low'. Hereinafter, operation of the I/O device 10b will be described in reference to FIGS. 2, 3a and 3b.

The pre-driver unit 400 includes a first pre-driver 410 and a second pre-driver 420. The first pre-driver 410 can be driven between the first voltage VDD and the sixth voltage VBBW in response to the first data signal D1. The sixth voltage VBBW may be a bulk voltage lower than the ground voltage VSS. The second pre-driver 420 can be driven between the fifth voltage VPPY and the second voltage VSS in response to the first data signal D1. The fifth voltage VPPY may be a bulk voltage higher than first voltage VDD.

In other words, although the first pre-driver 410 provides a 'high' level value of the first data signal D1, the first pre-driver 410 over-drives the second voltage VSS, which is a 'low' level, value to the sixth voltage VBBW which is much lower. And the first pre-driver 410 supplies the over-driven voltage to the pull-up unit 110. The second pre-driver 420 over-drives 'high' level values of the first data signal D1 to the fifth voltage VPPY, which is higher than the first voltage VDD. And, the second pre-driver 420 supplies the over-driven voltage to the pull-down unit 120 and provides the second voltage VSS which is the 'low' level value without modifying the second voltage VSS.

As a result, the first pre-driver 410 drives a low value of first data signal D1 to a much lower value, and the second pre-driver 420 drives a high value of first data signal D1 to a much higher value. The pre-drivers 410, 420 drives signals in this manner because the first pre-driver 410 is coupled with a gate terminal of a PMOS-type pull-up transistor M1, and the second pre-driver 420 is coupled with a gate terminal of an NMOS-type pull-down transistor M2.

The PMOS-type pull-up transistor M1 is turned on when a signal applied to its gate terminal (a pull-up driving signal PU of FIGS. 2 and 3a), to be more exact, a gate-source voltage Vgs is less than a threshold voltage. As a result, if a source voltage Vs is maintained at a constant level, as a gate voltage Vg decreases, that is, an absolute value of the gate voltage Vg increases, the PMOS-type pull-up transistor M1 may be easily turned on. Thus, if the first data signal D1 is a 'high' level, the first pre-driver 410 supplies the pull-up driving signal PU to the gate terminal of the pull-up transistor M1. However, if the first data signal D1 is a 'low' level, the first pre-driver 410 supplies the pull-up driving signal PU obtained by driving the first data signal D1 to the sixth voltage VBBW to the gate terminal of the pull-up transistor M1 in order to improve the turn-on driving speed.

The second pre-driver 420 supplies a pull-down driving signal PD to the gate terminal of the NMOS-type pull-down transistor M2. The NMOS-type pull-down transistor M2 is turned on when a value of a voltage value larger than the threshold voltage, such as the gate-source voltage Vgs, is applied to the gate terminal. As a result, if the source voltage Vs is maintained at a constant level, as the gate voltage Vg becomes larger, the NMOS-type pull-down transistor M2 may be easily turned on. Thus, if the first data signal D1 has a value of the second voltage VSS corresponding to the 'low' level, the second pre-driver 420 supplies the pull-down driving signal PD to the gate terminal of the pull-down transistor M2. However, if the first data signal D1 corresponds to the 'high' level, the second pre-driver 420 drives the first voltage VDD to the fifth voltage VPPY to supply the pull-down driving signal PD to the gate terminal of the pull-down transistor M2. As a result, the driving speed of the NMOS-type pull-down transistor M2 becomes faster.

Such a driving feature of the pre-driver unit 400 results from the MOS type characteristic of the pull-up transistor M1 and the pull-down transistor M2. If the pull-up transistor M1 is an NMOS-type and the pull-down transistor M2 is a PMOS-type, the driving method of the first pre-driver 410 is opposite to that of the second pre-driver 420. For example, the first pre-driver 410 is driven between the second voltage VSS and the fifth voltage VPPY to over-drive the 'high' level of the first data signal D1, and the second pre-driver 420 is driven between the first voltage VDD and the sixth voltage VBBW to over-drive the 'low' level of the first data signal D1.

The configurations and features of the pull-up unit 110, the transmission line 200, the receiver 300 and the latch 500 are substantially the same as those of FIG. 1 and thus, the detailed description thereof are not repeated.

The I/O device 10b may minimize consumption power required in the I/O operation and the time required in driving as well.

Figure 4A:
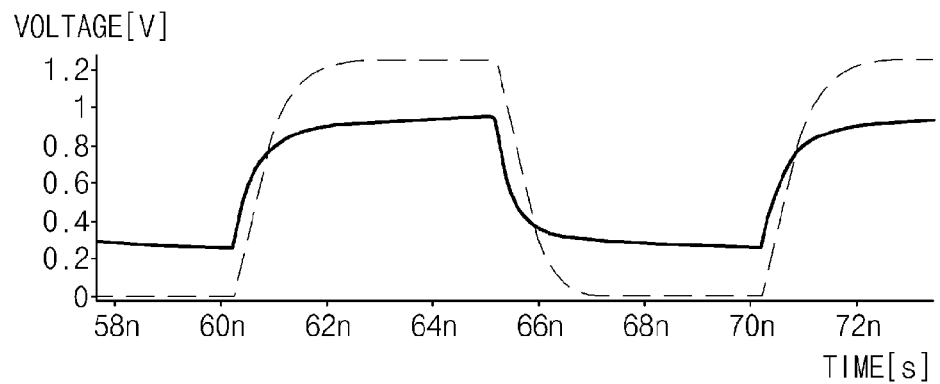
FIGS. 4a to 4c illustrate waveform diagrams of the I/O device according an embodiment of the present invention.
Figure 4B:
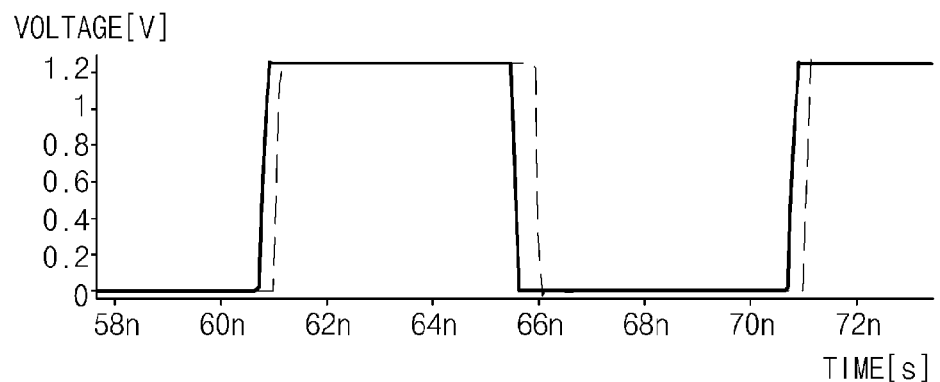
Figure 4C:
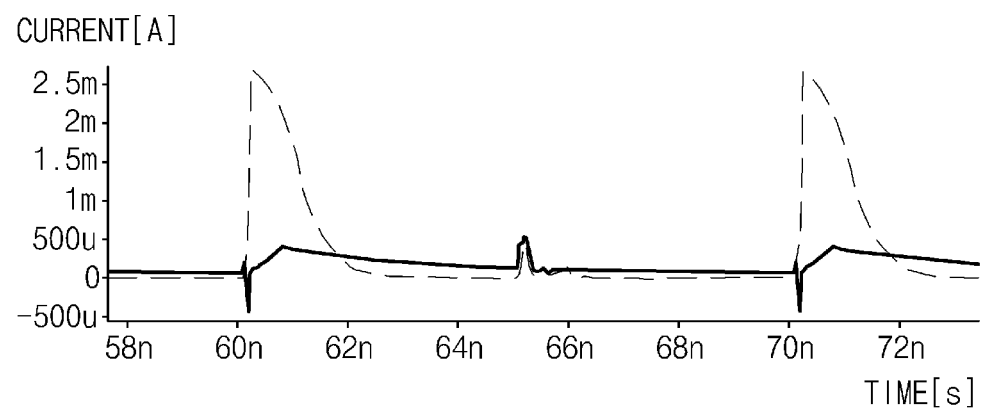

FIGS. 4a to 4c illustrate waveform diagrams of the I/O device according an example embodiment of the present invention.

Referring to FIGS. 4a to 4c, the dotted lines represent when the conventional method is used, and the solid lines represent when the I/O device according to an embodiment of the present invention is used.

FIG. 4a illustrates a waveform diagram of a waveform of the transmission data signal TD in the transmission line 200. Referring to FIG. 4a, in the case of the prior art, the transmission data signal TD fully swings between 0V and 1.2V. Here, 0V corresponds to the second voltage VSS, and 1.2V corresponds to the first voltage VDD. As mentioned above, if the voltage in the transmission line 200 fully swings, the influence of parasitic elements such as the resistance components R1, R2 and the capacitance component C1 increases so that the swing timing becomes late.

In the case of the I/O device according to an embodiment of the present invention, the transmission data signal TD swings between 0.2V and 1V. Since the swing range of the transmission data signal TD is reduced, the influence resulting from the resistance components R1, R2 and the capacitance component C1 may be minimized and thus, it is shown in FIG. 4a that the transition timing on 'high' and 'low' of data becomes faster.

FIG. 4b illustrates the data output signal DO. As described above, in the I/O device according to an embodiment of the present invention, the data output signal DO is transmitted with a reduced swing range. However, while the data output signal DO passes through the latch 500, which serves as a level shifter, the voltage level of 'high' and 'low' of data swings from 0V to 1.2V like the prior art.

As the timing of the signal supplied through the transmission line 200 becomes faster in FIG. 4a, the transition level of the lastly outputted data output signal DO also becomes faster. As a result, the speed of the data I/O operation may be improved.

FIG. 4c illustrates a waveform diagram of power consumption of an I/O device in accordance with an embodiment of the disclosure. FIG. 4c may correspond to an average value of current when the first data signal D1 toggled to 100 MHz is applied. As a result of calculation, referring to FIG. 4c, the operating current is reduced by 51% in comparison with the prior art. Also, the power where the same voltage is applied can decrease up to 51%.

Figure 5:
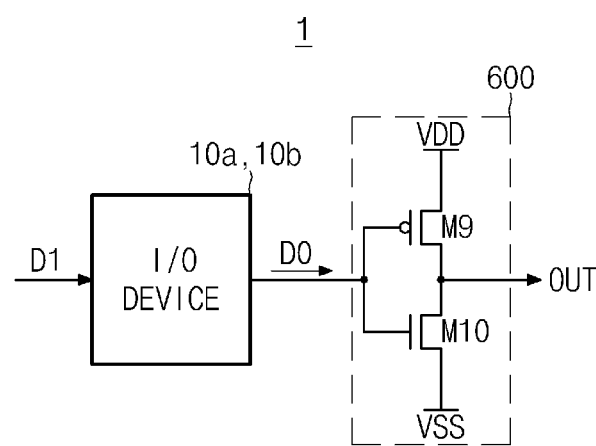
FIG. 5 illustrates an I/O system according to an embodiment of the present invention.

FIG. 5 illustrates an I/O system according to an embodiment of the present invention.

Referring to FIG. 5, an I/O system 1 includes the I/O device 10a, 10b and a final driving circuit 600. The I/O device 10a, 10b may be configured to receive the first data signal D1 so as to provide the data output signal DO.

The I/O device 10a, 10b has substantially the same configuration as described above in FIGS. 1 and 2, and performs substantially the same function. Therefore, a repeated discussion of the I/O device 10a, 10b is omitted.

The I/O device 10a, 10b includes a driving unit configured to receive the first data signal D1 that swings between a first voltage and a second voltage so as to provide a transmission data signal having a second swing range narrower than a first swing range. The I/O device 10a, 10b also includes a transmission line configured to transmit the transmission data signal as a reception data signal, and a receiver configured to adjust a swing range so that the reception data signal has the same second swing range as the transmission data signal. The receiver configured to match a middle point of the second swing range of the transmission data signal TD and a middle point of the second data signal D2.

Also, the I/O device 10a, 10b further includes a level shifter configured to adjust a voltage level so that a signal that swings with the second swing range may have the first swing range so as to supply the data output signal DO to the final driving circuit 600.

The final driving circuit 600 receives the adjusted data output signal DO so as to provide an output signal OUT.

According to an example embodiment of the present invention, the final driving circuit 600 may include complementary transistors M9 and M10 coupled between the first voltage VDD and the second voltage VSS.

With the I/O device and the I/O system according to an example embodiment of the present invention, the operating speed can be quickened and the power consumption can be minimized and thus, they can be diversely applied to electronic equipment that requires high speed and miniaturization.

Accordingly, the I/O device and the I/O system according to an example embodiment of the present invention reduces a swing range of a data signal transmitted through the I/O device to transmit the signal, thereby reducing the power consumption and the operating speed that may result from an increased swing range.

Furthermore, the I/O device and the I/O system according to an example embodiment of the present invention adjusts a driving voltage, such as a gate applying voltage, supplied to transistors in order to compensate degradation of the driving capacity resulting from a decrease of the swing range, thereby reducing the problem resulting from the driving capacity.

Although a number of illustrative embodiments consistent with the present invention have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings, and the accompanying claims. In addition to variations and modifications in the component parts and/or arrangements, alternative uses will also be apparent to those skilled in the art.

What is claimed is:

1. An input and output (I/O) device, comprising:
   a driving unit coupled between a first voltage and a second voltage, and configured to receive a first signal to drive a second signal to swing with a second swing range narrower than a first swing range where the first swing range is between the first voltage and the second voltage, and the driving unit is configured to supply the second signal to a transmission line, the driving unit including a first stabilizer coupled between the first voltage and the transmission line and a second stabilizer coupled between the second voltage and the transmission line; and
   a receiver coupled between the first voltage and the second voltage, and configured to receive the second signal through the transmission line to output a third signal, the receiver including a third stabilizer coupled between the first voltage and the transmission line and a fourth stabilizer coupled between the second voltage and the transmission line,
   wherein the receiver matches a middle point of the third signal and that of the second signal by adjusting the third signal to swing the second swing range.

2. The I/O device according to claim 1, wherein the first stabilizer and the third stabilizer are voltage lowering elements with the same structure, and the second stabilizer and the fourth stabilizer are voltage lowering elements with the same structure.

3. The I/O device according to claim 1, wherein the driving unit comprises:
   a pull-up unit including the first stabilizer and configured to drive the first signal to a high level; and
   a pull-down unit including the second stabilizer and configured to drive the first signal to a low level.

4. The I/O device according to claim 3, wherein the pull-up unit comprises a pull-up transistor coupled between the first stabilizer and the transmission line, and the pull-down unit comprises a pull-down transistor coupled between the second stabilizer and the transmission line.

5. The I/O device according to claim 4, wherein the first stabilizer is a first diode-connected transistor coupled serially between the first voltage and the pull-up transistor, and
   the second stabilizer is a second diode-connected transistor coupled serially between the second voltage and the pull-down transistor.

6. The I/O device according to claim 5, wherein a maximum point of the second swing range is less than the first voltage by a threshold voltage of the first diode-connected transistor, and a minimum point of the second swing range is greater than the second voltage by a threshold voltage of the second diode-connected transistor.

7. The I/O device according to claim 3, further comprising a pre-driver unit configured to supply a pull-up driving signal to the pull-up transistor in response to the first signal, based on a third voltage lower than the second voltage, or
   to supply a pull-down driving signal to the pull-down transistor in response to the first signal, based on a fourth voltage higher than the first voltage.

8. The I/O device according to claim 1, further comprising a level shifter configured to receive the third signal from the receiver so as to move a voltage to fall within the first swing range.

9. The I/O device according to claim 1, wherein the transmission line includes at least one selected from a resistance component and a capacitance component.

10. An I/O system, comprising:
    a driving unit configured to receive a data signal that falls within a first swing range, narrow the first swing range by including voltage lowering elements, and supply a transmission data signal that falls within a second swing range through a transmission line;
    a receiver configured to receive the transmission data signal as a reception data signal, adjust a swing range so that the reception data signal has the same second swing range as that of the transmission data signal, and match a middle point of the reception data signal and that of the data signal;
    a level shifter configured to adjust a voltage level so that the second swing range has the first swing range so as to supply a data output signal; and
    a final driving circuit configured to receive a data output signal having the adjusted voltage level.

11. The I/O system of claim 10, wherein the driving unit is coupled between the first voltage and the second voltage, and includes a first stabilizer coupled between the first voltage and the transmission line and a second stabilizer coupled between the second voltage and the transmission line, the first and second stabilizers being included in the voltage lowering elements, and
    the receiver is coupled between the first voltage and the second voltage, and includes a third stabilizer coupled between the first voltage and the transmission line and a fourth stabilizer coupled between the second voltage and the transmission line.

12. The I/O system of claim 11, wherein the first to fourth stabilizer have substantially the same structure.

* * * * *